United States Patent [19]
Schairer et al.

[11] Patent Number: 5,472,915
[45] Date of Patent: Dec. 5, 1995

[54] METHOD OF MANUFACTURING A OPTO-ELECTRONIC COMPONENT WITH NARROW APERTURE ANGLE

[75] Inventors: Werner Schairer, Weinsberg; Jörg Angerstein, Flein; Siegfried Giebler, Wüstenrot; Jürgen Riedel, Gemmingen; Thomas Mistele, Ilsfeld, all of Germany

[73] Assignee: Temic Telefunken microelectronic GmbH, Heilbronn, Germany

[21] Appl. No.: 306,942

[22] Filed: Sep. 16, 1994

Related U.S. Application Data

[62] Division of Ser. No. 128,659, Sep. 30, 1993, Pat. No. 5,384,471.

[30] Foreign Application Priority Data

Oct. 2, 1992 [DE] Germany ............... 42 33 125.0
Apr. 7, 1993 [DE] Germany ............... 43 11 530.6

[51] Int. Cl.⁶ ................................................. H01L 21/60
[52] U.S. Cl. ................... 437/209; 437/3; 437/4; 437/214; 437/217
[58] Field of Search ................. 437/3, 4, 6, 209, 437/211, 214, 215, 217, 219, 220; 257/79, 80, 81, 82, 83, 84, 98, 99, 100

[56] References Cited

U.S. PATENT DOCUMENTS

| | | |
|---|---|---|
| 3,727,064 | 4/1973 | Bottini . |
| 3,863,075 | 1/1975 | Ironmonger et al. . |
| 4,114,177 | 9/1978 | King .......................... 257/81 |
| 4,118,633 | 10/1978 | Guilleman et al. ........... 257/82 |
| 4,203,792 | 5/1980 | Thompson ................... 437/220 |
| 4,284,898 | 8/1981 | Felkel et al. . |
| 4,712,017 | 12/1987 | Kamasaki .................... 257/82 |
| 4,857,746 | 8/1989 | Kuhimann et al. ........... 437/3 |
| 4,878,107 | 10/1989 | Hopper ........................ 257/82 |
| 5,040,868 | 8/1991 | Waitl et al. . |
| 5,105,239 | 4/1992 | Uchino et al. ............... 257/82 |
| 5,119,174 | 6/1992 | Chen . |
| 5,216,805 | 6/1993 | Hallenbeck et al. ......... 437/3 |

FOREIGN PATENT DOCUMENTS

| | | |
|---|---|---|
| 917812 | 12/1972 | Canada . |
| 0364806 | 10/1989 | European Pat. Off. . |
| 0450560A2 | 10/1991 | European Pat. Off. . |
| 883105 | 5/1953 | Germany . |
| 2309586 | 8/1973 | Germany . |
| 2506373BW | 8/1975 | Germany . |
| 2543247B2 | 4/1976 | Germany . |
| 2749455A1 | 5/1978 | Germany . |
| 2941634A1 | 4/1980 | Germany . |
| 2905734A1 | 7/1980 | Germany . |
| 3137685C2 | 4/1983 | Germany . |
| 3316271A1 | 10/1984 | Germany . |
| 3732075A1 | 4/1989 | Germany . |
| 3835942A1 | 4/1990 | Germany . |
| 01232775 | 9/1989 | Japan . |
| 01241184 | 9/1989 | Japan . |
| 01230274 | 9/1989 | Japan . |
| 1232775 | 9/1989 | Japan ..................... 257/82 |
| 01273367 | 11/1989 | Japan . |
| 2105586 | 4/1990 | Japan ..................... 257/81 |
| 02130876 | 5/1990 | Japan . |
| 02280388 | 11/1990 | Japan . |
| 3151674 | 6/1991 | Japan ..................... 257/81 |
| 02288478 | 12/1991 | Japan . |
| 434873 | 8/1977 | U.S.S.R. ................. 257/81 |

Primary Examiner—Kevin M. Picardat
Attorney, Agent, or Firm—Spencer, Frank & Schneider

[57] ABSTRACT

The invention relates to an opto-electronic component having a narrow aperture angle. The conventional design of components transmitting radiation or reacting to radiation and concentrating that radiation with the aid of lenses results, on account of the increasing distance between the lens and the semiconductor chip, in increasing component dimensions in the radiating or detecting direction with an increasingly narrow aperture angle. In accordance with the invention, a parabolic or approximately parabolic reflector is provided that is connected to a support strip supporting the semiconductor chip such that the latter is as close as possible to the focal point of the parabolic or approximately parabolic surface of the reflector. The reflector is preferably connected to the support strip by engaging elements and surrounded by a housing.

5 Claims, 3 Drawing Sheets

METHOD OF MANUFACTURING A OPTO-ELECTRONIC COMPONENT WITH NARROW APERTURE ANGLE

This is a Division of application Ser. No. 08/128,659, filed Sep. 30, 1993, now U.S. Pat. No. 5,384,471.

BACKGROUND OF THE INVENTION

The invention relates to a method or process for manufacturing an opto-electronic component having a narrow aperture angle and including a semiconductor chip for emitting or reacting to radiation mounted on a support strip.

Conventional opto-electronic semiconductor components such as LEDs have single-shell plastic lenses for narrowing the aperture angle. Components of this type are described in, for example, Gillessen, Schairer "Light emitting diodes: an introduction", Prentice-Hall International, 1987, p. 217–219, FIGS. 7-6. These conventional components have the drawback that a narrowing of the radiation angle $\phi$ involves an increase in the focal distance f. At the same time, the component dimensions in the radiation direction are increased. Causally linked with this is the fact that with given lens diameters and hence, generally speaking, given component diameters, the aperture angle $\alpha$ becomes smaller and at the same time, in the case of an opto-emitter, the useful output falls. In the case of a detector, the quantity of incident luminous power is reduced. The general correlation between the radiation angle $\phi$ of the component, the focal distance f of the lens and the aperture angle $\alpha$ in the known components is shown in FIG. 4.

SUMMARY OF THE INVENTION

The object underlying the invention is to provide a method of manufacturing an opto-electronic component having a narrow radiation angle and at the same time is distinguished by low depth and high power yield.

This object is attained by a process according to the invention for manufacturing an opto-electronic component having a narrow aperture angle, which comprises the steps of mounting a semiconductor chip on a support strip, forming electrical contacts between the semiconductor chip and the support strip, and prior to formation of a housing, connecting a reflector to the support strip such that the semiconductor chip is facing the reflector and is substantially at its focal point.

Advantageous embodiments of its manufacturing process are the subject of sub-claims.

In particular, the opto-electronic component in accordance with the invention can be used to provide an opto-coupler. To do so, an opto-emitter and an opto-detector in accordance with the invention are placed opposite one another and optically and mechanically coupled via a housing.

In an array of this type, the emitter chip and the detector chip are accommodated in a Faraday cage formed by the metallic support strip and the metallic reflector. Accordingly, each of the two chips is in an almost zero-field space, regardless of the voltage applied.

This leads, with an opto-coupler of this type, to a substantial improvement in the long-term voltage resistance; this is because the DC voltage applied over a long period means a heavy load on the chips, in particular on the detector chip. The load increases at roughly the same rate as the voltage, the temperature, and the time during which all variations in the specifications must remain below a preset limit.

The stated load results from the fact that a force acts on charges in the passivation layers under the influence of the field strength determined by the voltage. If charges move, the latter are enriched at the boundary surfaces of the passivation layer. The result can be depletion layers or even inversion layers in the adjacent silicon material that might alter the function data of the chip.

Corresponding effects can result even in the case of stable passivation layers on account of the plastic in which the chips are embedded. If the plastic contains charges, these will tend to drift and possibly become enriched at the surfaces of the semiconductor chips, leading to more or less major changes in the measurement data depending on the design of these chips.

Since the chips of the opto-coupler described above and made up of the opto-electronic components in accordance with the invention are in an almost zero-field space, the loads described above are kept clear of them. In high-voltage couplers in particular, where peak voltages of more than 5 $kV_{ss}$ can occur, the field caused by this voltage is shielded.

A solution of this type is cheaper and substantially more effective than known opto-couplers. In addition, it is an advantage that very small receiver chips can be used in an opto-coupler of this type and that the distance between opto-emitter and opto-detector can be increased without any major effect on the coupling factor as a result of the narrow aperture angle of the components. Finally, the overall length of the opto-coupler is relatively short in spite of the wide distance.

BRIEF DESCRIPTION OF THE DRAWINGS

FIG. 1a shows a side view of an advantageous embodiment of the component,

FIG. 1b shows a front view of the embodiment shown in FIG. 1a,

DESCRIPTION OF THE PREFERRED EMBODIMENTS

Figures 1A, 1B:
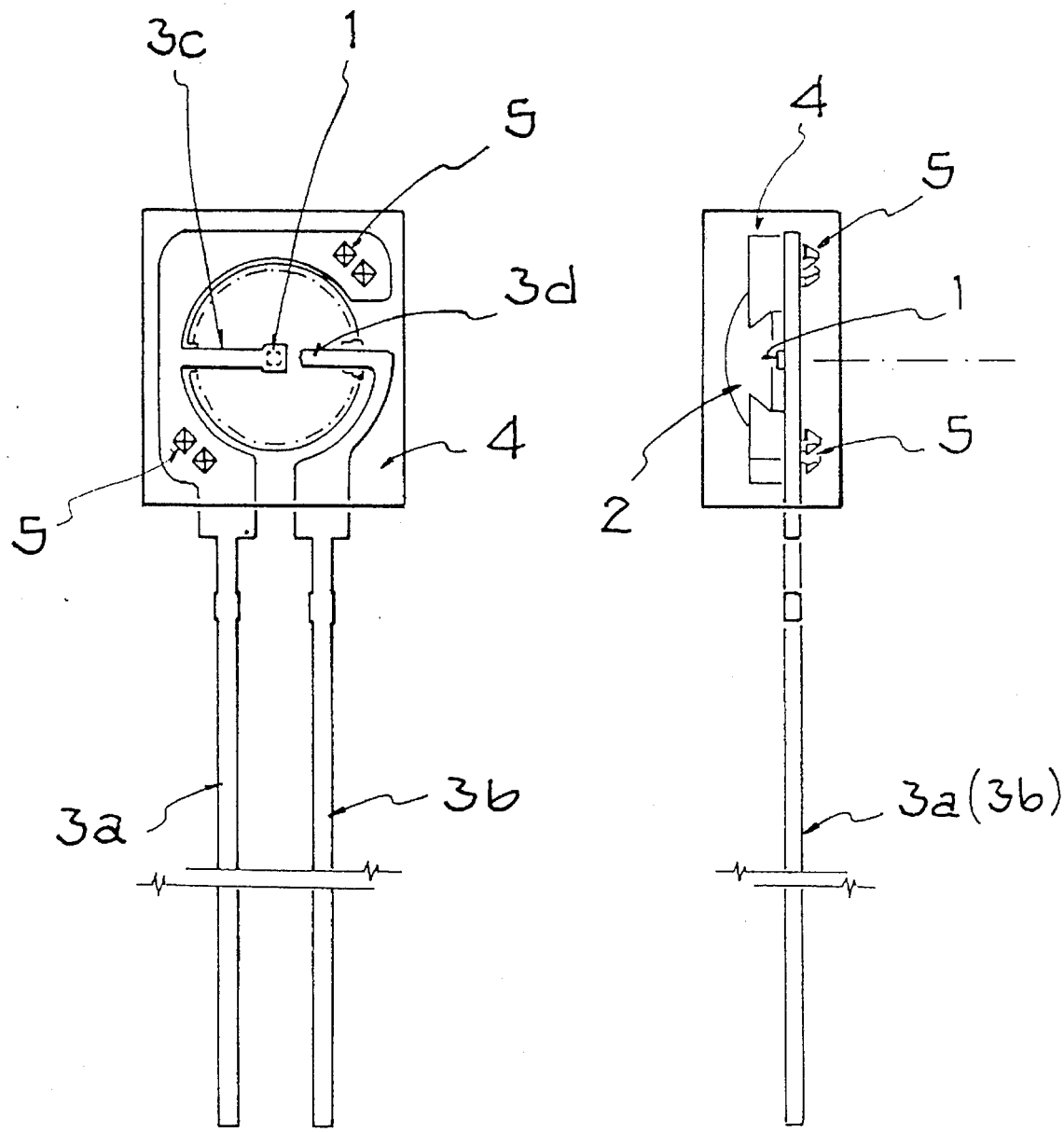

The component shown in FIG. 1 comprises an opto-electronic semiconductor chip 1, which can either be a receiver reacting to radiation or an emitter transmitting radiation. For both embodiments, the opto-emitter and the opto-detector, the following applies in equivalent form. It only remains to reverse the light path 7 in the two views, to change over the emitted and detected radiation outputs etc.

The semiconductor chip 1 is mounted on a support strip 3. This support strip 3 consists in the illustrated embodiment of two substantially parallel legs 3a, 3b. In the upper area, leg 3a has a branch 3c pointing in the direction of the other leg. The branch 3c of the one leg reaches slightly past the symmetrical axis of the reflector. The semiconductor chip 1 is accommodated at the free end of this branch 3c in the center of the reflector and is electrically connected to both parts 3a and 3b of the support strip 3. This is advantageously achieved using a back surface contact for the partial strip 3c on which the semiconductor chip 1 is mounted. Electrical connection to the other partial strip 3b, and in particular to its upper inwardly directed branch 3d, is achieved using a bond wire. It is of course also possible to contact both connections with bond wires, particularly when the two electrical connections of the semiconductor chip 1 are arranged on the upper face of the latter. It is furthermore possible to continue the strip 3d into the center of the reflector and to mount the chip there.

At the time of assembly of the semiconductor chip and of the reflector, the supply lines 3a, 3b of the two part-strips are connected by links (not shown). The ends are not cut free to provide two separate connections until after the component has been embedded.

A reflector 2 is provided on the support strip 3 such that the semiconductor chip 1 is as close as possible to the focal point of the parabolic reflector 2. The reflector 2 has in an advantageous embodiment engaging elements 5 into which the support strip 3 is firmly engaged or latched. It is of course also possible to connect the support strip 3 and the reflector 2 in a different way to one another, e.g. by a bonded connection. The entire array is surrounded by a housing 4, with one part of each support strip 3a, 3b projecting out of the housing 4 and serving as a connection and mounting pin for the component. The housing 4 advantageously consists of a translucent plastic and is made by, for example, embedding the array in a synthetic resin compound.

The following describes a process for manufacture of the component described above. Firstly, conventional process steps are used to manufacture the semiconductor chip 1 and the support strip 3. The support strip already has the form shown in FIG. 1, except that the two part-strips are connected to one another by links (now shown) at the two lower legs 3a, 3b that later form the connection pins. At the other end, one of the two part-strips has a branch 3c which approaches a branch 3d of the other strip 3b. The semiconductor chip is mounted on the strip section 3c or 3d projecting into the center of the reflectors. If the semiconductor chip 1 has a back surface contact, assembly is by soldering or gluing using a conductive synthetic adhesive. In this process, an electrical contact is created at the same time to the one part-strip 3c of the support strip 3. The second electrical contact is made by a wire bond process. This connects a contact on the upper side of the semiconductor chip 1 to the second part-strip 3b. In another embodiment, the semiconductor chip is glued to the longer branch 3c. Then the electrical contacts of the semiconductor chip are connected to the part-strip. This is best achieved using a known wire bonding process. In the next process step, the reflector 2 is connected to the contact strip 3 so that the semiconductor chip 1 is facing the reflector 2 and is as close as possible to its focal point. If the reflector 2 is provided with engaging elements 5, the support strip 3 is only engaged in a precise position in the engaging elements or hooks 5. To facilitate positioning, positioning aids such as tapered tips on the engaging hooks 5 can be provided.

In a further embodiment of the process, the reflector 2 is merely glued to the strip.

Finally, the array is provided with a translucent housing 4. This is achieved by a process known per se, for example by embedding it in a synthetic resin compound. The array is completely embedded, with only the ends 3a, 3b of the support strip that are intended as connection pins remaining free. The connection links described above, which gave the array the necessary strength during assembly, are then removed.

The opto-electronic component made in this way has smaller dimensions in the radiation and incidence directions with a very small aperture angle. In addition, a very high beam parallelism and a very wide aperture angle are achieved with the component in accordance with the invention.

Figure 2A:
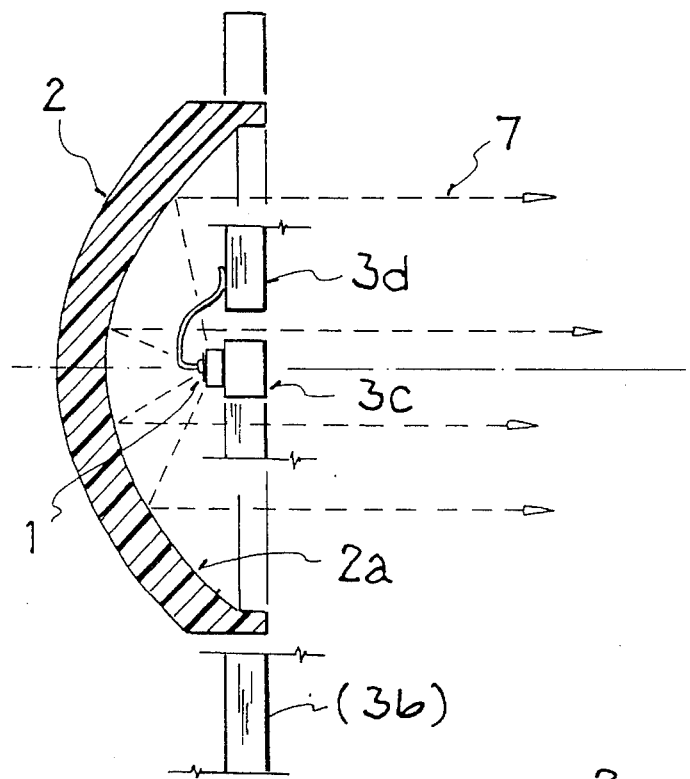
FIGS. 2a and 2b are a cross-sectional view and an isometric view showing the precise form of the reflector.
Figure 2B:
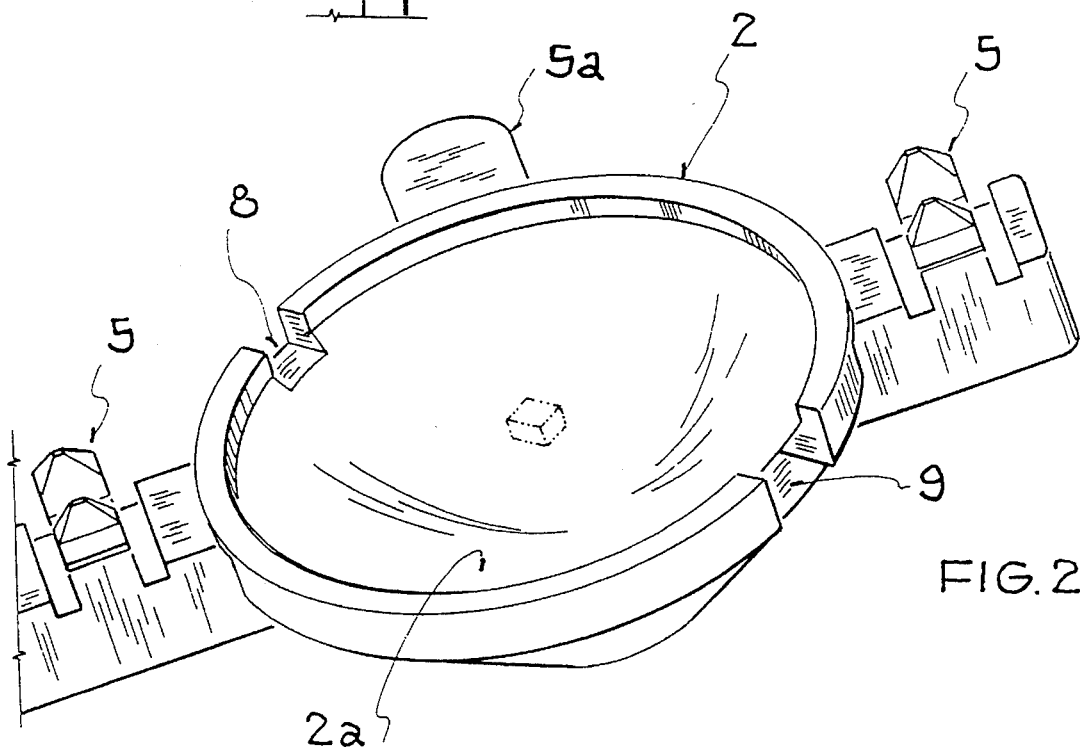
Figure 3:
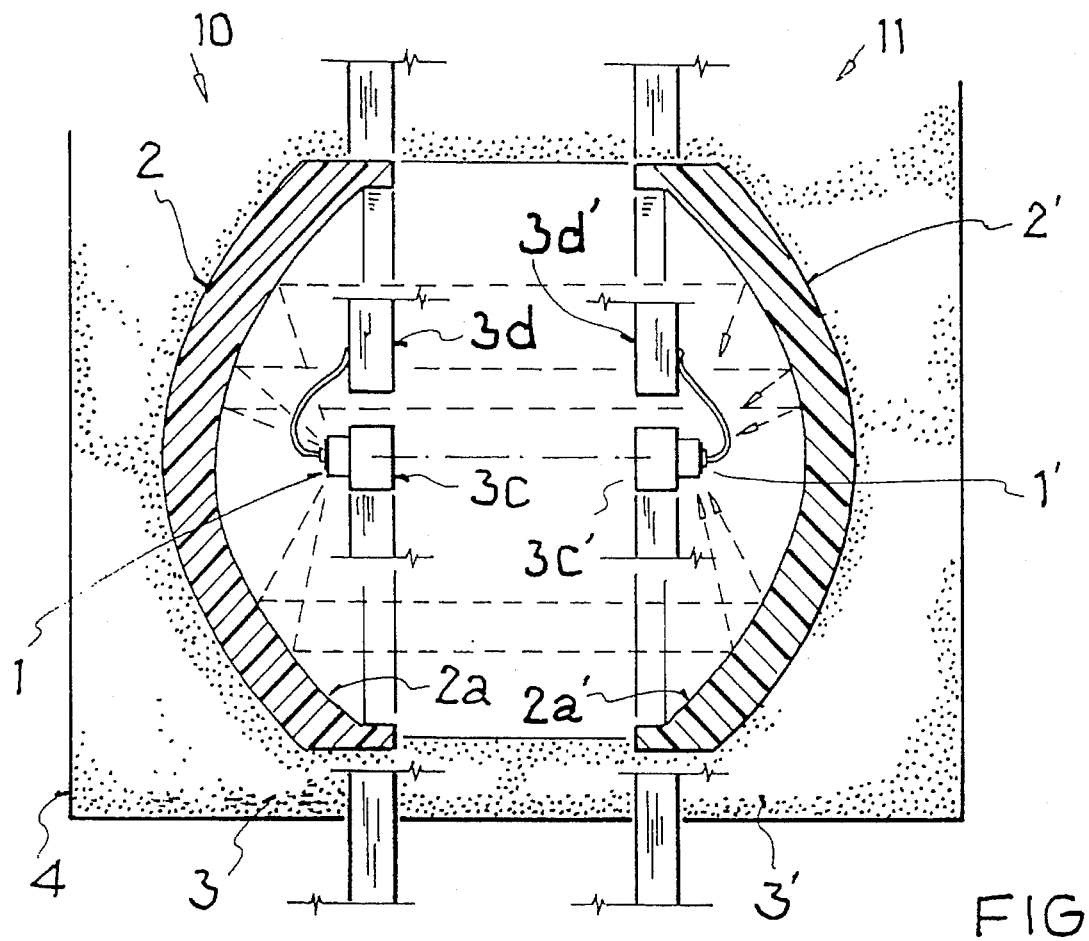
FIG. 3 shows a side view of an opto-coupler made up of opto-electronic components in accordance with the invention, FIG. 4, alluded to above, shows a feature of the prior art.
Figure 4:
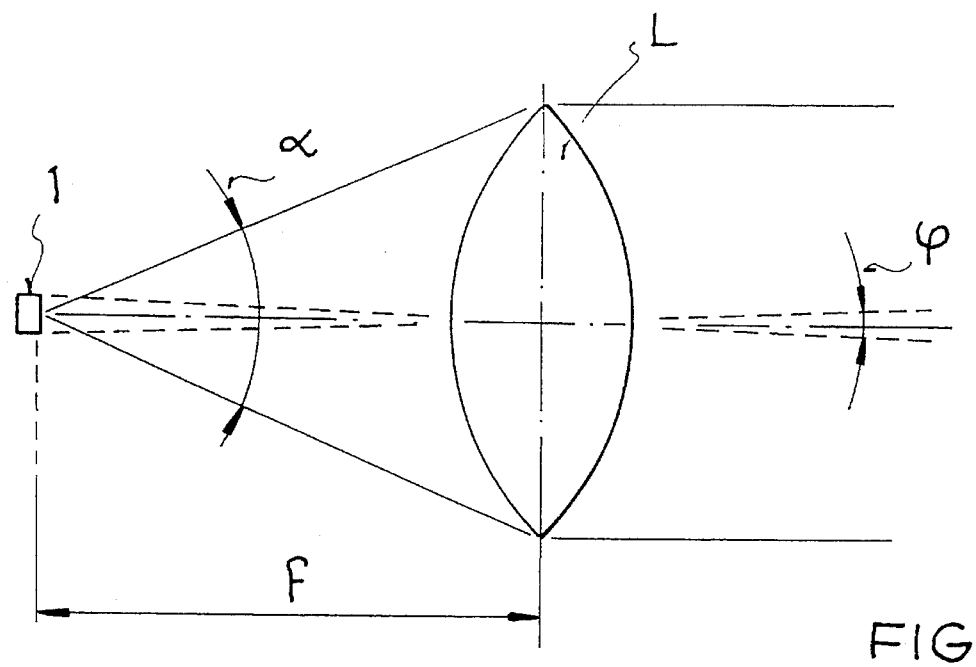

The opto-electronic components in accordance with the invention as described in FIGS. 1 and 2, which can be used both as opto-emitters and opto-detectors, can be used to manufacture an opto-coupler in accordance with FIG. 3, in which reference numbers 10 and 11 refer to an opto-emitter and an opto-detector respectively. The various parts of these components are designated with the appropriate reference numbers from FIGS. 1 and 2, with the reference numbers of the opto-emitter 10 being provided without raised marks and those of the opto-detector 11 with raised marks. FIG. 3 now shows clearly that each chip, i.e. both the emitter chip 1 and the detector chip 1', is in a Faraday cage formed by the reflector 2 or 2' and the support strip 3 or 3' respectively. The surface 2a or 2a' of the reflector 2 or 2' respectively is metallized and connected in electrically conducting manner to a part 3a or 3b, or 3a' or 3b' respectively of the appropriate support strip 3 or 3', in order to ensure the Faraday cage effect. It is thus possible to shield the electrical field generated by the separating voltage applying between the receiving and the transmitting sides, such that a high voltage resistance is assured in the long term.

The fact that the chips 1 and 1' are at the focal points of the reflectors 1 and 1' respectively means that the radiation 7 emitted by the emitter chip 1 is focussed almost entirely on the detector chip 1', allowing very small receiving chips to be used and hence permitting a reduction in the cost of manufacturing the opto-coupler. The advantage that the distance between the two components 10 and 11 can be increased without greatly affecting the coupling factor can also be attributed to the same cause.

What is claimed is:

1. A process for manufacturing an opto-electronic component having a narrow aperture angle comprising the steps of;

mounting a semiconductor chip on a support strip;

making electrical contacts between said semiconductor chip and said support strip;

providing a discrete reflector having engaging elements on which the support strip engages during assembly;

connecting the reflector from said providing step to said support strip using the engaging elements such that said semiconductor chip is facing said reflector and is at its focal point; and subsequent to said connecting step, forming a housing to enclose at least the reflector.

2. Use of the opto-electronic component according to claim 1 for manufacture of an opto-coupler made up of an opto-emitter and an opto-detector where said reflectors 2') of both said opto-emitter and said opto-detector have metal coatings and where said metal coatings of each reflector are connected in an electrically conducting manner to one of two part-strips, respectively, of the appropriate support strip carrying the emitter chip or detector chip, respectively.

3. A process for manufacturing an opto-electronic component having a narrow aperture angle comprising the steps of;

mounting a semiconductor chip on a support strip; making electrical contacts between said semiconductor chip and said support strip;

connecting a discrete reflector to said support strip by gluing such that said semiconductor chip is facing said reflector and is at its focal point; and subsequent to said connecting step, forming a housing to enclose at least the reflector.

4. Use of the opto-electronic component according to claim 3 for manufacture of an opto-coupler made up of an opto-emitter and an opto-detector where said reflectors of both said opto-emitter and said opto-detector have metal coatings and where said metal coatings of each reflector are connected in an electrically conducting manner to one of two part-strips, respectively, of the appropriate support strip carrying the emitter chip or detector chip, respectively.

5. Method for manufacture of an opto-coupler having a narrow aperture angle and made up of an opto-emitter and an opto-detector comprising the steps of:

mounting a semiconductor emitter chip and a semiconductor detector chip on respectively different support strips;

making electrical contacts between each respective semiconductor chip and an associated respective support strip;

connecting a respective discrete reflector, each provided with a conductive coating, to the respective support strips such that each semiconductor chip is facing and is at the focal point of the associated respective one of the reflectors;

connecting the metal coating of each reflector in an electrically conducting manner to one of two part-strips of the associated respective support strip carrying the respective emitter chip or detector chip to form an opto-emitter and an opto-detector, respectively;

positioning the opto-emitter and the opto-detector so that the respective semiconductor chips and reflectors face one another; and, embedding the reflectors, the chips and the juxtaposed portions of the support strips in a translucent material to form a housing.

* * * * *